(12) United States Patent
Fukuda

(10) Patent No.: US 9,826,139 B2
(45) Date of Patent: Nov. 21, 2017

(54) IMAGE PROCESSING APPARATUS, IMAGE PROCESSING METHOD, PROGRAM, AND IMAGE PICKUP APPARATUS HAVING THE IMAGE PROCESSING APPARATUS

(71) Applicant: CANON KABUSHIKI KAISHA, Tokyo (JP)

(72) Inventor: Koichi Fukuda, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/427,463

(22) PCT Filed: Sep. 11, 2013

(86) PCT No.: PCT/JP2013/075216
§ 371 (c)(1),
(2) Date: Mar. 11, 2015

(87) PCT Pub. No.: WO2014/046152
PCT Pub. Date: Mar. 27, 2014

(65) Prior Publication Data
US 2015/0249782 A1 Sep. 3, 2015

(30) Foreign Application Priority Data
Sep. 21, 2012 (JP) .................. 2012-208871

(51) Int. Cl.
*H04N 5/232* (2006.01)
*H04N 5/225* (2006.01)

(52) U.S. Cl.
CPC ....... *H04N 5/23212* (2013.01); *H04N 5/2254* (2013.01)

(58) Field of Classification Search
CPC .... H04N 5/23212; H04N 5/2254; G02B 7/28; G02B 7/34; G02B 7/36; G03B 13/36
See application file for complete search history.

(56) References Cited

U.S. PATENT DOCUMENTS

| 4,410,804 A | 10/1983 | Stauffer |
| 2006/0182433 A1* | 8/2006 | Kawahara ............... G03B 3/10 396/123 |

(Continued)

FOREIGN PATENT DOCUMENTS

| CN | 101103380 A | 1/2008 |
| CN | 101212566 A | 7/2008 |

(Continued)

OTHER PUBLICATIONS

International Search Report and Written Opinion issued in corresponding application No. PCT/JP2013/075216 on Feb. 26, 2014.

(Continued)

*Primary Examiner* — Luong T Nguyen
(74) *Attorney, Agent, or Firm* — Carter, DeLuca, Farrell & Schmidt, LLP

(57) ABSTRACT

An image processing apparatus for processing image pickup signals of subpixels of an image pickup element including a plurality of unit pixels each of which has a plurality of subpixels for receiving light passing through different partial pupil areas of a focusing optical system and generating image data of a photographed image, obtains in-focus information of the photographed image, sets a first area and a second area different from the first area onto the photographed image on the basis of the obtained in-focus information, and adds a part of the image pickup signals of the subpixels obtained from the image pickup element so that the number of image pickup signals of the subpixels per unit pixel in the image data of the photographed image corresponding to the first area is larger than that of the image data of the photographed image corresponding to the second area.

16 Claims, 13 Drawing Sheets

(56) References Cited

U.S. PATENT DOCUMENTS

| | | | | |
|---|---|---|---|---|
| 2007/0242942 | A1* | 10/2007 | Nozaki | G03B 13/18 396/123 |
| 2008/0152215 | A1 | 6/2008 | Horie et al. | |
| 2010/0097515 | A1* | 4/2010 | Ishii | H04N 5/23219 348/349 |
| 2011/0001814 | A1* | 1/2011 | Yamanaka | A61B 5/117 348/78 |
| 2011/0129165 | A1* | 6/2011 | Lim | H04N 5/23212 382/255 |
| 2011/0205423 | A1* | 8/2011 | Tsukada | G02B 7/38 348/345 |

FOREIGN PATENT DOCUMENTS

| | | |
|---|---|---|
| CN | 101978688 A | 2/2011 |
| CN | 102652432 A | 8/2012 |
| JP | 2001-083407 A | 3/2001 |

OTHER PUBLICATIONS

Ng et al., "Light Field Photography with a Hand-held Plenoptic Camera", Stanford Tech Report CTSR Feb. 2005, pp. 1-11.
Chinese office action issued in corresponding Chinese application No. 201380049160.9 dated Jun. 1, 2017.

\* cited by examiner

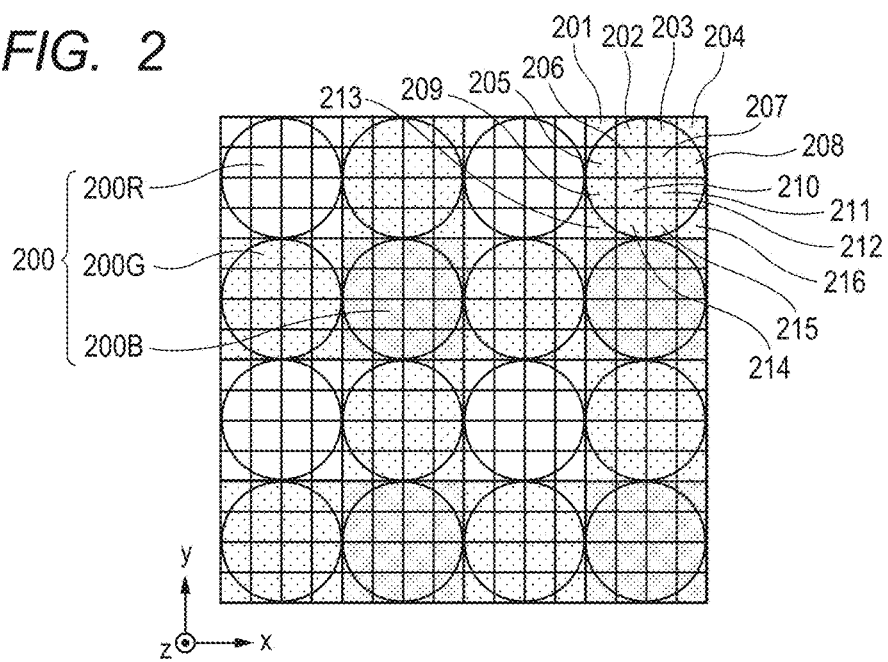
FIG. 2
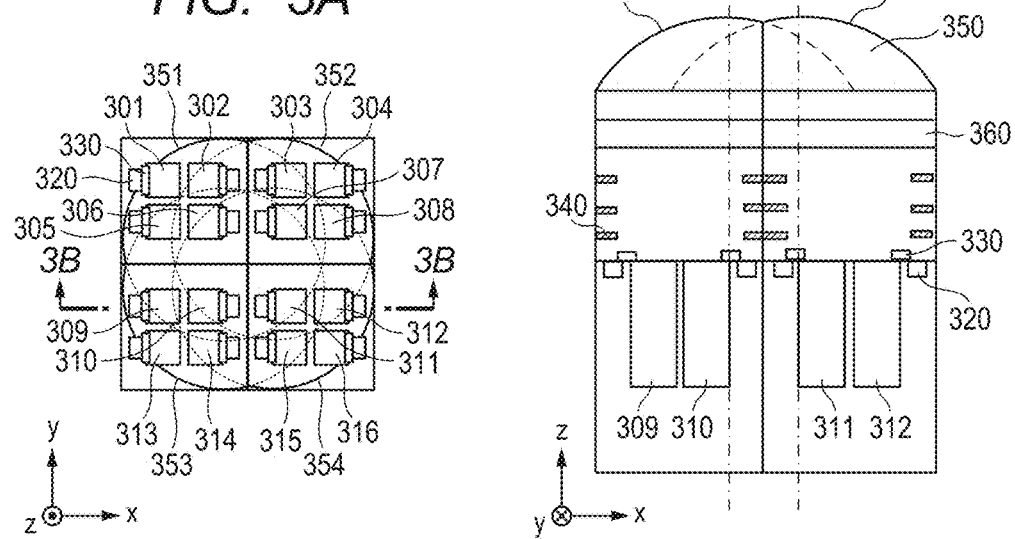
FIG. 3A
FIG. 3B

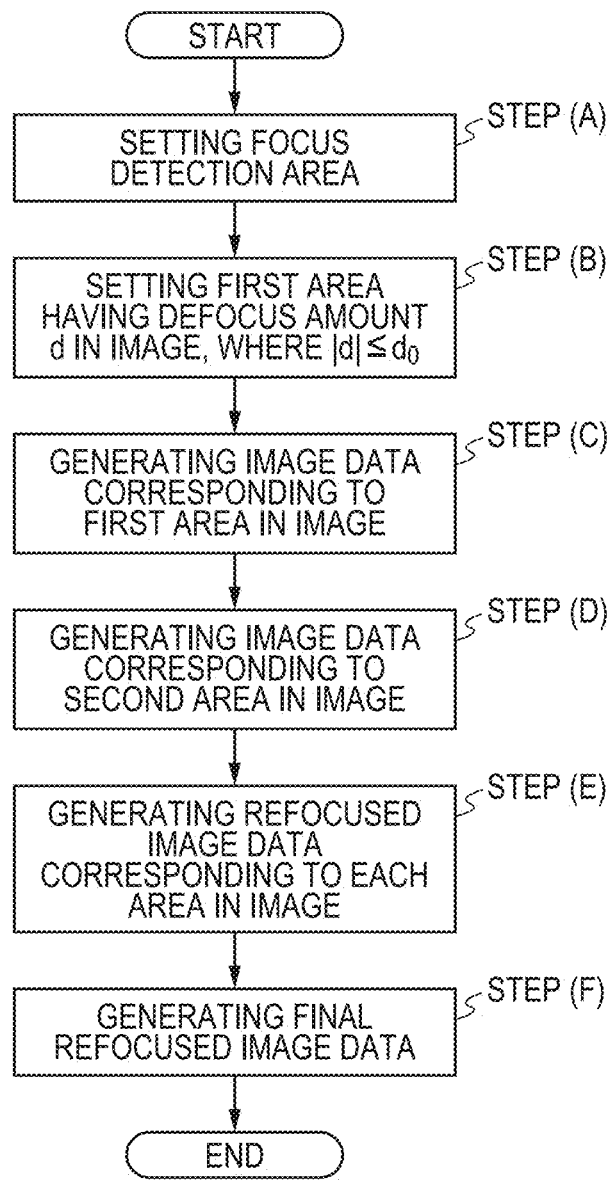

IMAGE PROCESSING APPARATUS, IMAGE PROCESSING METHOD, PROGRAM, AND IMAGE PICKUP APPARATUS HAVING THE IMAGE PROCESSING APPARATUS

CROSS REFERENCE TO RELATED APPLICATIONS

This application is a National Stage Application of International Application No. PCT/JP2013/075216 filed on Sep. 11, 2013, which claims the benefit of and priority to Japanese Patent Application No. 2012-208871, filed Sep. 21, 2012, each of which are hereby incorporated by reference herein in their entirety.

TECHNICAL FIELD

The invention relates to an image processing apparatus, an image processing method, a program, and an image pickup apparatus having the image processing apparatus and, more particularly, to an image processing apparatus, image processing method, and program for processing a parallax image or image data for refocus, and an image pickup apparatus having the image processing apparatus.

BACKGROUND ART

An image pickup apparatus which divides an exit pupil of a photographing lens into a plurality of areas and can simultaneously photograph a plurality of parallax images corresponding to the divided pupil areas has been proposed.

PTL 1 discloses an image pickup apparatus having a two-dimensional image pickup element in which one pixel corresponds to one microlens and the pixel is formed by a plurality of divided photoelectric conversion units. The divided photoelectric conversion unit is constructed so as to receive light from different partial pupil areas of an exit pupil of a photographing lens through one microlens and performs a pupil division. A plurality of parallax images corresponding to the divided partial pupil areas can be formed from an image signal generated by photoelectrically converting object light received by each of the divided photoelectric conversion units. PTL 2 discloses such a technique that a picked-up image is generated by adding, on the pixel basis, all of image signals which are output from divided photoelectric conversion units.

A plurality of photographed parallax images are equivalent to Light Field (LF) data serving as space distribution of light intensity and angle distribution information. NPL 1 discloses such a refocus technique that by composing images on a virtual focusing plane different from an image pickup plane by using the obtained LF data, an in-focus position of the picked-up image is changed after the photographing.

CITATION LIST

Patent Literature

PTL 1: U.S. Pat. No. 4,410,804
PTL 2: Japanese Patent Application Laid-Open No. 2001-083407

Non Patent Literature

NPL 1: Stanford Tech Report CTSR 2005-02, 1 (2005)

SUMMARY OF INVENTION

Technical Problem

However, there is such a problem that since the LF data is constructed by a plurality of parallax images and contains the angle distribution information of each pixel in addition to the space distribution information of the light intensity, a data amount is large.

The invention is made in consideration of the foregoing problems and it is an object of the invention to provide an image processing apparatus and method which can hold necessary information and suppress a data amount of LF data.

Solution to Problem

According to the invention, an image processing apparatus for processing image pickup signals of subpixels obtained by an image pickup element constructed by arranging a plurality of pixels each of which is constructed by a plurality of subpixels for receiving light passing through different partial pupil areas of a focusing optical system and generating image data of a photographed image which is photographed by the image pickup element, comprises: an area setting unit configured to set at least one area into the photographed image; an addition processing unit configured to subject the image pickup signal of the subpixel of the set area to an addition processing; and an image processing control unit configured to obtain in-focus information on the basis of the image pickup signal of the subpixel of the area set by the area setting unit, control the area setting unit so as to set a first area and a second area which are different from the set area on the basis of the obtained in-focus information, and control the addition processing unit so as to subject the image pickup signals of the subpixels of the set first and second areas to the addition processing of different degrees, thereby generating first image data and second image data as image data of the photographed image.

Advantageous Effects of Invention

According to the image processing apparatus of the invention, the data amount of the LF data can be suppressed, while holding the necessary information.

Further features of the present invention will become apparent from the following description of exemplary embodiments with reference to the attached drawings.

BRIEF DESCRIPTION OF DRAWINGS

FIG. 2 is a diagram schematically illustrating a pixel array in an image pickup element according to the present embodiment of the invention.

FIGS. 3A and 3B are diagrams illustrating a pixel structure of the image pickup element according to the present embodiment of the invention.

FIG. 10 is a diagram illustrating a flowchart for the image processing operation according to the first embodiment of the invention.

DESCRIPTION OF EMBODIMENTS

Exemplary embodiments of the invention will be described in detail hereinbelow on the basis of the drawings.

Example 1

Figure 1:
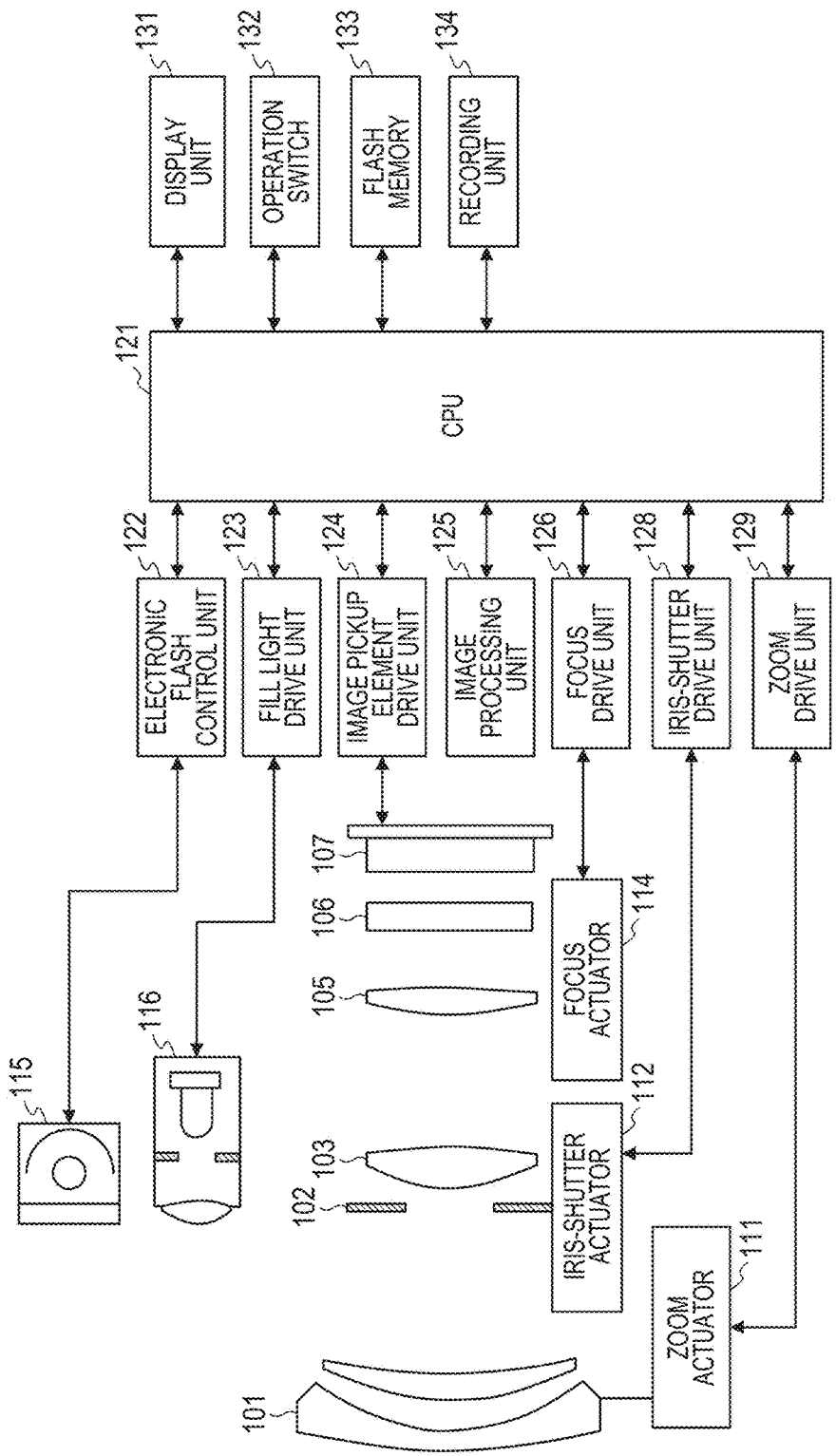
FIG. 1 is a block diagram of an image pickup apparatus to which an image processing according to an embodiment of the invention is applied.

FIG. 1 is a block diagram illustrating a construction of a camera serving as an image pickup apparatus to which an image processing apparatus and method according to the invention are applied. The image pickup apparatus has an image pickup element which can obtain LF data as will be described hereinafter. In this diagram, a first lens group 101 is arranged at the front of a focusing optical system and is held being movable backward and forward in an optical axis direction. An iris shutter 102 performs a light amount adjustment upon photographing by adjusting an aperture diameter and also has a function as a shutter for adjusting an exposure time upon photographing of a still image. A second lens group 103 is provided. The iris shutter 102 and the second lens group 103 integratedly move backward and forward in the optical axis direction, thereby realizing a magnification effect (zoom function) by the interlocking motion with the backward/forward operation of the first lens group 101.

A third lens group 105 performs a focus adjustment by the backward/forward motion in the optical axis direction. An optical low-pass filter 106 is an optical element for reducing a false color and moire of the photographed image. An image pickup element 107 is constructed by a two-dimensional CMOS photosensor and peripheral circuits and is arranged on a focusing plane of the focusing optical system.

In order to perform the magnification operation, a zoom actuator 111 rotates a cam barrel (not shown) and drives the first lens group 101 or the third lens group 105 backward and forward in the optical axis direction. In order to adjust a photographing light amount, an iris-shutter actuator 112 controls the aperture diameter of the iris shutter 102 and controls the exposure time upon photographing of the still image. In order to perform the focus adjustment, a focus actuator 114 drives the third lens group 105 backward and forward in the optical axis direction.

Although a flash illuminating apparatus using a xenon tube is preferable as an electronic flash 115 for illuminating an object upon photographing, an illuminating apparatus having a continuous light-emitting LED may be used. An AF fill light unit 116 projects an image of a mask having a predetermined aperture pattern onto a field through a light projection lens, thereby improving a focus detecting ability to a dark object or a low-contrast object.

A CPU 121 provided in a camera performs various kinds of control of the camera body. The CPU 121 has an arithmetic operating unit, a ROM, a RAM, an A/D converter, a D/A converter, a communication interface circuit, and the like. The CPU 121 loads and executes a predetermined program stored in the ROM, thereby driving and controlling various kinds of circuits provided for the camera and realizing the AF, photographing, image processing, and a series of operations such as a recording and the like. Therefore, the CPU 121 is a unit constructing the image processing apparatus according to the invention and makes image processing control in the image processing apparatus.

An electronic flash control unit 122 controls on/off of the illuminating unit 115 synchronously with the photographing operation. A fill light drive unit 123 controls on/off of the AF fill light unit 116 synchronously with the focus detecting operation. An image pickup element drive unit 124 controls the image pickup operation of the image pickup element 107, A/D converts the obtained image pickup signal, and transmits to the CPU 121. An image processing unit 125 executes processings such as gamma conversion, color interpolation, JPEG compression, and the like of the image signal obtained by the image pickup element 107.

A focus drive unit 126 drives the focus actuator 114 on the basis of a focus detection result and drives the third lens group 105 backward and forward in the optical axis direction in order to perform the focus adjustment. An iris-shutter drive unit 128 drives the iris-shutter actuator 112 and controls an aperture of the iris shutter 102. A zoom drive unit 129 drives the zoom actuator 111 in accordance with the zoom operation of the photographer.

A display unit 131 such as an LCD or the like displays information regarding a photographing mode of the camera, a preview image before photographing, an image for confirmation after the photographing, an in-focus state display image at the time of a focus detection, and the like. An operation switch group 132 is constructed by a power switch, a release (photographing trigger) switch, a zoom operation switch, a photographing mode selection switch, and the like. A photographed image is recorded into a detachable flash memory 133 in a predetermined recording format by a recording unit 134.

Subsequently, the image pickup element 107 provided for the image pickup apparatus will be described. A pixel array and a subpixel array of the image pickup element 107 according to the present embodiment are schematically illustrated in FIG. 2. FIG. 2 illustrates the pixel array of a two-dimensional CMOS sensor (image pickup element) according to the present embodiment by a range of (4 rows×4 columns). Since each pixel of the image pickup element according to the present embodiment is divided into (4×4) subpixels, FIG. 2 illustrates the range of subpixel of (16 rows×16 columns) when considering the subpixel array. The actual image pickup element is not limited to the pixel array of (4 rows×4 columns) (subpixel array of 16 rows×16 columns) illustrated in FIG. 2 but is constructed in such a manner that a number of pixels are arranged onto a light-receiving plane, thereby enabling an object image to be picked up. The present embodiment will be described by presuming the image pickup element in which a pixel period $\Delta X$ is equal to 9.2 μm and the number of effective pixels $N_{LF}$ is equal to 10.14 million pixels (=3900 columns in the lateral direction×2600 rows in the vertical direction), while a subpixel period $\Delta x$ is equal to 2.3 μm and the number of effective subpixels N is equal to 162 million pixels (=15600 columns in the lateral direction×10400 rows in the vertical direction).

In the present embodiment, in a pixel group 200 of (2 rows×2 columns) illustrated in FIG. 2, a pixel 200R having spectrum sensitivity of R (red) is arranged at a left upper position, pixels 200G having spectrum sensitivity of G (green) are arranged at a right upper position and a left lower position, and a pixel 200B having spectrum sensitivity of B (blue) is arranged at a right lower position, respectively. Further, in each pixel, subpixels 201 to 216 of $N_\theta \times N_\theta$ (4 rows×4 columns) are two-dimensionally arranged.

A plan view of one pixel 200G of the image pickup element illustrated in FIG. 2 in the case where it is viewed on the light-receiving side (+z side) of the image pickup element is illustrated in FIG. 3A. A cross sectional view taken along the line 3B-3B in FIG. 3A in the case where it is viewed on the −y side is illustrated in FIG. 3B.

As illustrated in FIGS. 3A and 3B, in the pixel 200G in the present embodiment, a microlens 350 to converge the incident light onto the light-receiving plane of each pixel is formed, and photoelectric conversion units 301 to 316 divided into $N_\theta$ areas (4-division) in the x direction and $N_\theta$ areas (4-division) in the y direction are formed, respectively. The photoelectric conversion units 301 to 316 correspond to the subpixels 201 to 216, respectively.

Each of the photoelectric conversion units 301 to 316 may be a pin structure photodiode with an intrinsic layer being interposed between a p-type layer and an n-type layer or a pn-junction photodiode in which an intrinsic layer is omitted in accordance with necessity.

In each pixel, a color filter 360 is formed between the microlens 350 and the photoelectric conversion units 301 to 316. Spectrum transmissivity of the color filter may be changed for every subpixel or the color filter may be omitted in accordance with necessity.

The light which entered the pixel 200G illustrated in FIGS. 3A and 3B is converged by the microlens 350, is color-separated by the color filter 360, and thereafter, is received by the photoelectric conversion units 301 to 316.

In the photoelectric conversion units 301 to 316, an electron and a hole are generated through pair production in accordance with a light reception amount and are separated by a depletion layer. After that, the electron of a negative charge is accumulated into the n-type layer (not shown) and, on the other hand, the hole is ejected to the outside of the image pickup element through the p-type layer connected to a constant voltage source (not shown).

In the present embodiment, as illustrated in FIG. 3B, an electric capacitor portion (FD: floating diffusion) 320 and a transfer gate 330 are formed every two photoelectric conversion units on the right and left sides thereof. A wiring layer 340 is formed over the microlens 350 side of the electric capacitor portion (FD) 320.

The electrons accumulated in the n-type layers (not shown) of the photoelectric conversion units 301 to 316 are transferred to the electric capacitor portions (FD) 320 through the transfer gates 330, are converted into voltage signals, and are output as photoelectric conversion signals.

In the present embodiment, as illustrated in FIGS. 3A and 3B, the microlens 350 is formed by $N_\theta$ (four) submicrolenses 351 to 354 in such a shape that an optical axis (vertex) of each submicrolens is deviated in the different direction and the adjacent submicrolenses are in line-contact with each other. An alternate long and short dash line in FIG. 3B indicates the optical axis (vertex) of the submicrolens. The photoelectric conversion unit is divided into $N_\theta \times N_\theta$ (4×4) areas and the electric capacitor portions (FD) 320 are arranged adjacently to the photoelectric conversion units 301 to 316. Further, the wiring layer 340 also serving as a light-shielded layer is formed between the microlens 350 and the FD 320. The FD 320 are arranged in the areas where the light converged by the microlens does not enter, adjacently to the photoelectric conversion units 301 to 316.

Figure 4A:
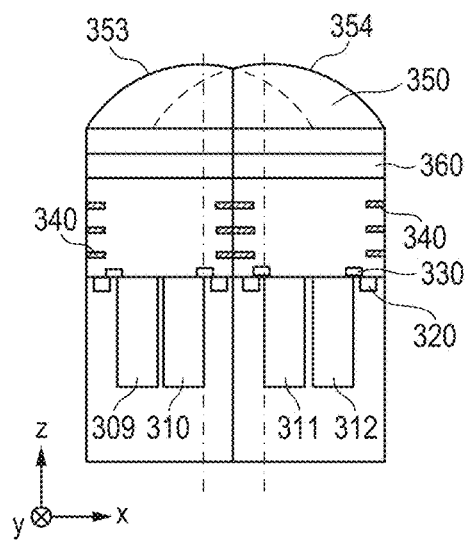
FIGS. 4A, 4B, 4C, and 4D are diagrams illustrating pixel structures which are substantially optically-equivalent to the pixel structure of the image pickup element according to the present embodiment of the invention.
Figure 4C:
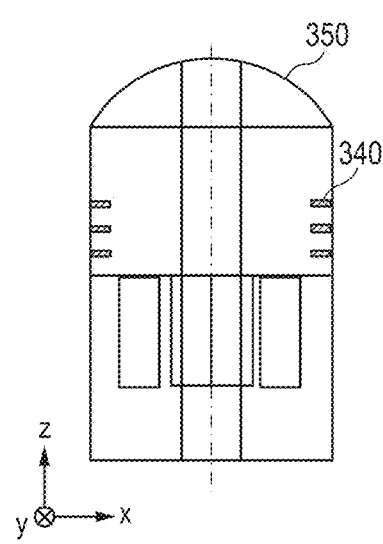
Figure 4B:
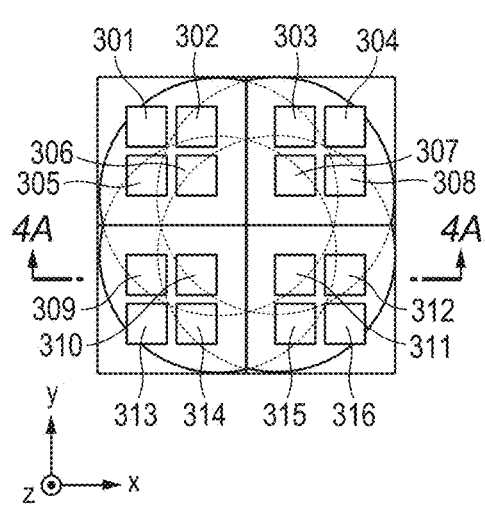
Figure 4D:
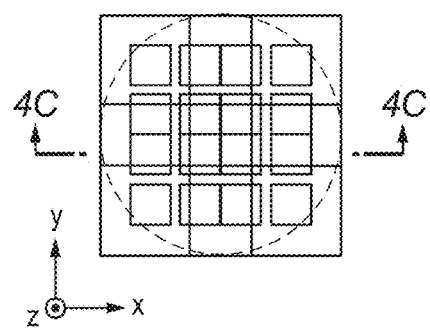

FIGS. 4A and 4B illustrate a schematic cross sectional view and a schematic plan view of the pixel in the present embodiment constructed by the microlens 350 comprising a plurality of submicrolenses in each of which the optical axis (vertex) is deviated and a plurality of divided photoelectric conversion units 301 to 316 illustrated in FIGS. 3A and 3B. FIGS. 4C and 4D illustrate a schematic cross sectional view and a schematic plan view of the pixel structure which is substantially optically-equivalent to the structure of the pixel in the present embodiment. If the pixel structure of the present embodiment illustrated in FIGS. 4A and 4B is reconstructed in such a manner that all of the optical axes (vertices) of the submicrolenses constructing the microlens overlap with each other, it becomes the substantially optically-equivalent pixel structure as illustrated in FIGS. 4C and 4D. Influences of isolation area between the photoelectric conversion units 306, 307, 310, and 311 in a pixel center portion and influences of the areas of the FD 320 and the wiring layers 340 also serving as light-shielded layers can be optically suppressed.

Figure 5:
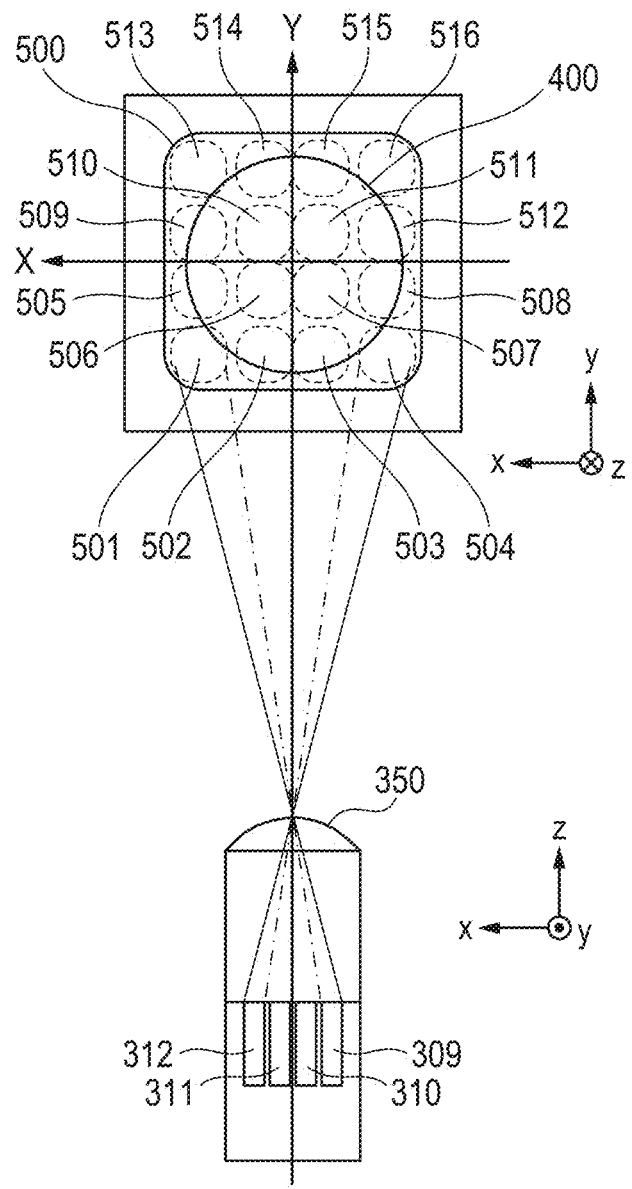
FIG. 5 is a diagram conceptually illustrating a relation between a pixel and a pupil division in the image pickup element according to the present embodiment of the invention.

An optical correspondence relation between the photoelectric conversion units of the pixel structure as illustrated in FIGS. 4C and 4D which is substantially optically-equivalent to the pixel structure in the present embodiment and in which the isolation area in the pixel center portion and the wiring layers are eliminated and the pupil division is conceptually illustrated in FIG. 5. This diagram illustrates a cross section in the case where the cross sectional view taken along the line 4C-4C of the pixel structure as illustrated in FIGS. 4C and 4D which is substantially optically-equivalent to the pixel structure in the present embodiment is viewed on the +y side, and also illustrates an exit pupil plane of the focusing optical system. In FIG. 5, in order to obtain a correspondence with a coordinate axis of the exit pupil plane, an x axis and a y axis of the cross sectional view are reversed as compared with those in FIGS. 3A, 3B, and 4A to 4D.

The image pickup element is arranged near the focusing plane of the photographing lens (focusing optical system). The light beam from the object passes through an exit pupil 400 of the focusing optical system and enters each pixel. Partial pupil areas 501 to 516 are substantially conjugate with the light-receiving planes of the $N_\theta \times N_\theta$ (4×4) divided photoelectric conversion units 301 to 316 (subpixels 201 to 216) by the microlens and show light-receivable partial pupil areas every photoelectric conversion unit (subpixel). A pupil area 500 is a light-receivable pupil area in the whole pixel 200G in the case where all of the $N_\theta \times N_\theta$ (4×4) divided photoelectric conversion units 301 to 316 (subpixels 201 to 216) are combined.

While a pupil distance is equal to tens of mm, since a diameter of the microlens 350 is equal to a few μm, an iris value of the microlens 350 is equal to tens of thousands and a diffraction blur of a level of tens of mm occurs. Therefore, the image at the light-receiving plane of the photoelectric conversion unit does not become a clear pupil area or partial pupil areas but becomes pupil intensity distribution (distribution of an angle of incidence of a light-receiving ratio).

Figure 6:
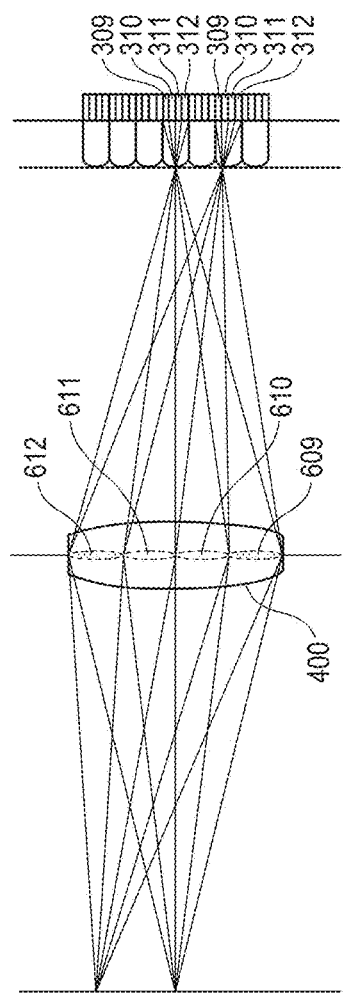
FIG. 6 is a diagram conceptually illustrating a relation between the image pickup element according to the present embodiment of the invention and the pupil division.

A correspondence relationship between the image pickup element of the present embodiment and the pupil division is conceptually illustrated in FIG. 6. The light beams which passed through the different partial pupil areas 609 to 612 among the partial pupil areas 501 to 516 enter the pixels of the image pickup element at different angles and are received by the $N_\theta \times N_\theta$ (4×4) divided photoelectric conversion units 301 to 316 (subpixels 201 to 216), respectively. Thus, LF data showing space distribution of the light intensity and angle distribution can be obtained by the image pickup element of the present embodiment. The LF data in the present embodiment is obtained by the image pickup element formed by arranging a plurality of pixels in each of which a plurality of subpixels for receiving the light beams passing through the different partial pupil areas of the focusing optical system are provided.

From the LF data, a parallax image corresponding to a specific partial pupil area among the partial pupil areas 501 to 516 of the focusing optical system is obtained by selecting the signal of a specific subpixel from the subpixels 201 to 216 of each pixel. For example, by selecting the signal of the subpixel 209 (photoelectric conversion unit 309) for every pixel, a parallax image having a resolution of the number of effective pixels corresponding to the partial pupil area 509 of the focusing optical system can be obtained. This is true of other subpixels. Therefore, in the present embodiment, a plurality of (the number of pupil division $N_p = N_\theta \times N_\theta$) parallax images of every different partial pupil areas are obtained by the image pickup element constructed by arranging the plurality of pixels each of which is constructed by the plurality of subpixels for receiving the light beams passing through the different partial pupil areas of the focusing optical system.

By adding all of the signals of the subpixels 201 to 216 for every pixel, a picked-up image having the resolution of the number of effective pixels can be generated.

Subsequently, a relation between the defocus amount of the LF data obtained from the image pickup element according to the present embodiment and the image shift amount will be described.

Figure 7:
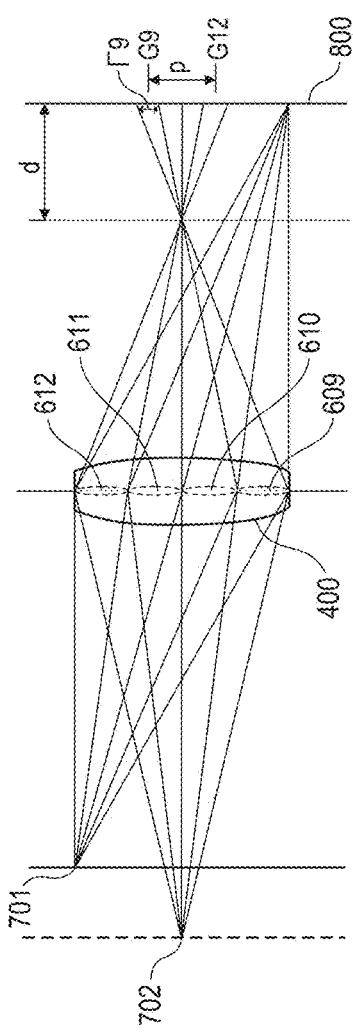
FIG. 7 is a diagram conceptually illustrating an image shift amount between parallax images and a defocus amount in the image pickup element according to the present embodiment of the invention.

FIG. 7 is a diagram conceptually illustrating the relation between the image shift amount between the parallax images and the defocus amount. The image pickup element (not shown) according to the present embodiment is arranged at an image pickup plane 800 and the exit pupil 400 of the focusing optical system is divided into the N.sub.p (16) partial pupil areas 501 to 516 as shown in FIG. 5) in a manner similar to FIGS. 5 and 6.

A defocus amount d is defined on the assumption that a distance from the focusing position of the object to the image pickup plane is equal to a magnitude |d|, a state in which a focal point of the object is on the object side of the image pickup plane is negative (d<0), and a state in which the focal point of the object is on the opposite side of the image pickup plane is positive (d>0). An in-focus state in which the focal point of the object is on the image pickup plane is d=0. In FIG. 7, an example in which an object 701 is in the in-focus state (d=0) is illustrated, and an example in which an object 702 is in the state (d<0) in which the focal point of the object is on the object side of the image pickup plane is illustrated. It is assumed that the state (d<0) in which the focal point of the object is on the object side of the image pickup plane and the state (d>0) in which the focal point of the object is on the opposite side of the image pickup plane are together referred to as a defocus state (|d|>0).

In the state (d<0) in which the focal point of the object is on the object side of the image pickup plane, the light beam which passes through the partial pupil area 509 (501 to 516) among the light beams from the object 702 is converged, thereafter, is spread to an area of a width Γ09 (Γ01 to Γ16) in which a position of the center of gravity G09 (G01 to G16) of the light beam is set to a center, and becomes a blurred image at the image pickup plane 800. The blurred image is received by the subpixel 209 (201 to 216) constructing each pixel arranged in the image pickup element and a parallax image is generated. Therefore, in the parallax image which is generated from the signal of the subpixel 209 (201 to 216), the object 702 is recorded at the position of the center of gravity G09 (G01 to G16) as a blurred object image which is blurred with the blur width Γ09 (Γ01 to Γ16) of the object image. The blur width Γ09 (Γ01 to Γ16) of the object image increases substantially in proportion to an increase in magnitude |d| of the defocus amount d. Similarly, a magnitude |p| of the image shift amount p (=difference between the positions of the center of gravity of the light beams: for example, G09−G12, or the like) of the object image between the parallax images also increases substantially in proportion to an increase in magnitude |d| of the defocus amount d. Also in the state (d>0) in which the focal point of the object is on the opposite side of the image pickup plane, a similar phenomenon occurs although the image shift direction of the object image between the parallax images is opposite to that in the state (d<0) in which the focal point of the object is on the object side of the image pickup plane. In the in-focus state (d=0), the positions of the center of gravity of the object image between the parallax images coincide (p=0) and an image shift does not occur.

Therefore, in the LF data of the invention, in association with an increase in magnitude of the defocus amount of the LF data, a magnitude of the image shift amount among the plurality of parallax images which are generated from the LF data for every different partial pupil area increases.

In the present embodiment, a focus detection of an image pickup plane phase difference method is performed by calculating the image shift amount between the parallax images by a correlation arithmetic operation from such a relationship that the magnitude of the image shift amount between the parallax images increases in association with the increase in magnitude of the defocus amount of the LF data. Although such a calculation can be performed by the image processing unit 125 under control of the CPU 121, the focus detection may be performed by using a focus detecting apparatus of a phase difference method, constructed separately from the image pickup element in accordance with necessity. The focus detection of a contrast method may be performed by using the LF data.

Figure 8:
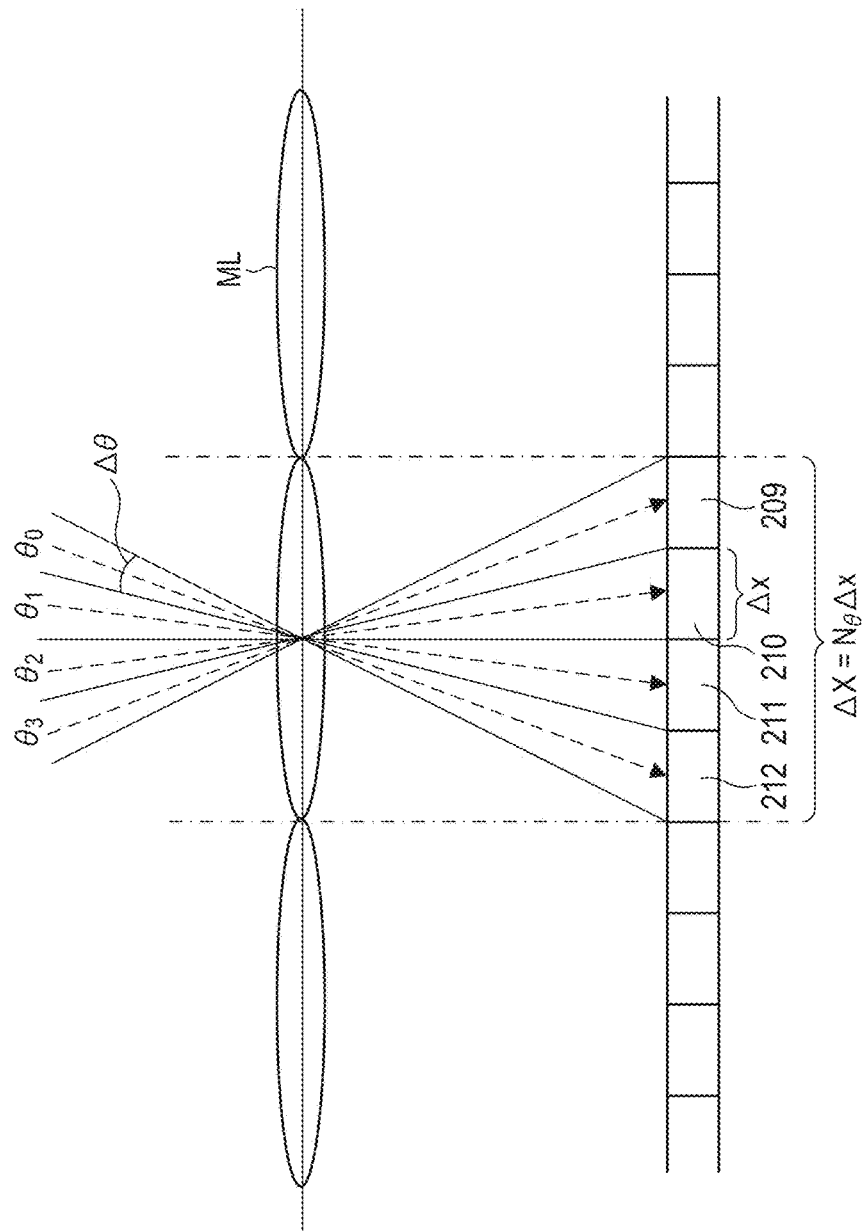
FIG. 8 is a diagram conceptually illustrating a relation between subpixels and angle information which can be obtained in the image pickup element according to the present embodiment of the invention.

Subsequently, a refocus processing using the foregoing LF data obtained from the image pickup element and a refocus-possible range in such a case will be described. A relation between the subpixels in the present embodiment and angle information which can be obtained is conceptually illustrated in FIG. 8. Assuming that the subpixel period is equal to $\Delta x$ and the number $N_p$ of division of the subpixels per pixel is equal to $N_p = N_\Theta \times N_\Theta$, as illustrated in the diagram, the pixel period $\Delta X = N_\Theta \Delta x$. Assuming that an angular resolving power is equal to $\Delta\theta$ and an angle viewing the exit pupil of the focusing optical system is equal to $\theta$, then $\Delta\theta = \theta/N_\Theta$. When a paraxial approximation is used, assuming that an iris value of the focusing optical system is equal to F, a relational expression of $N_\Theta F \approx 1/\Delta\theta$ is substantially satisfied. Each of the subpixels 212 to 209 receives the light beam in a range from an angle of incidence $\theta_0$ to an angle of incidence $\theta_3$ among all of the light beams which entered the pixel. The light beam of an angle of incidence having a width of the angular resolving power $\Delta\theta$ enters each subpixel.

Figure 9A:
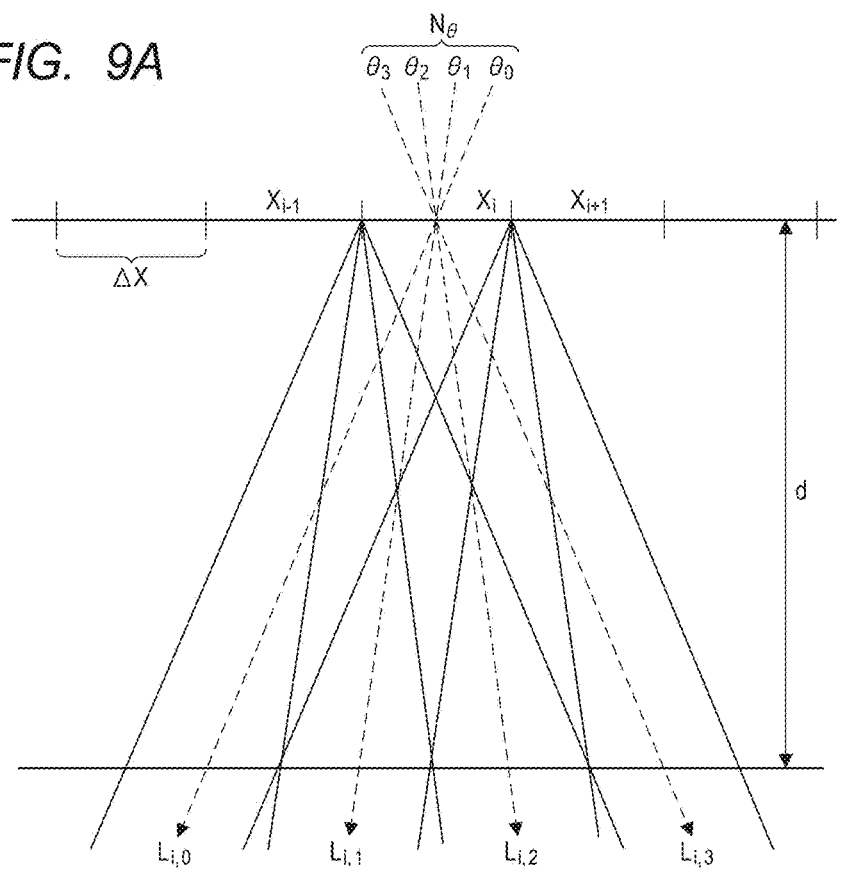
FIGS. 9A and 9B are diagrams conceptually illustrating a refocus processing in the image pickup element according to the present embodiment of the invention.

A conceptual diagram of the refocus processing in the present embodiment is illustrated in FIG. 9A. In FIG. 9A, each pixel $X_i$ (i=0 to $N_{LF}-1$) of the image pickup element arranged at the image pickup plane is schematically shown by a line segment. The light beam which enters the ith pixel $X_i$ at an angle $\theta_a$ (a=0 to $N_\Theta-1$) is received by each subpixel. The received subpixel signal is assumed to be $L_{i,a}$ (a=0 to $N_\Theta-1$). In the image pickup element of the present embodiment, the LF data serving as space distribution of the light intensity and angle distribution information can be obtained and is constructed by a plurality of parallax images of every different partial pupil areas.

After the photographing, a virtual focusing plane image different from the image pickup plane at which the image pickup element is arranged and from which the subpixel signal $L_{i,a}$ is obtained can be generated (refocus processing) from the LF data. All of the subpixel signals $L_{i,a}$ are moved in parallel along each angle $\theta_a$ from the image pickup plane to the virtual focusing plane, to be distributed to each virtual pixel at the virtual focusing plane, and are subjected to a weighted addition, so that a refocused image at the virtual focusing plane can be generated. As for coefficients which are used in the weighted addition, all values are positive and the sum of them is equal to 1.

Figure 9B:
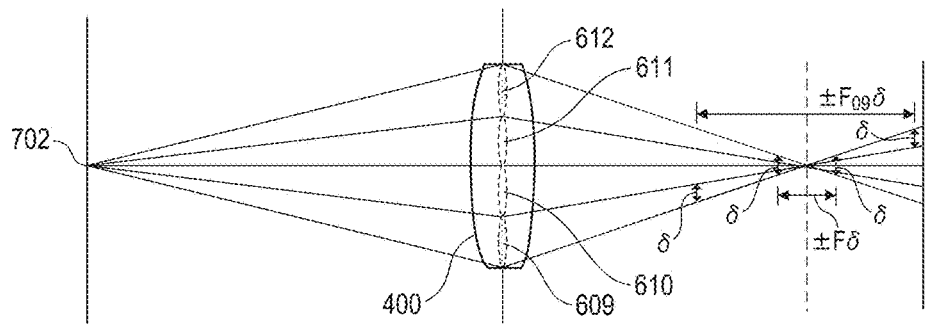

A conceptual diagram of the refocus-possible range in the present embodiment is illustrated in FIG. 9B. Assuming that a permissible circle of confusion is expressed by $\delta$ and the iris value of the focusing optical system is equal to F, a depth of field at the iris value F is equal to $\pm F\delta$. On the other hand, an effective iris value $F_{09}$ ($F_{01}$ to $F_{16}$) of the ($N_\Theta \times N_\Theta$) divided narrow partial pupil areas is equal to $F_{09} = N_\Theta F$ which is darker. An effective depth of field of each parallax image is equal to $\pm N_\Theta F\delta$ which is deeper by $N_\Theta$ times. An in-focus range is widened by $N_\Theta$ times. In the range of the effective depth of field of $\pm N_\Theta F\delta$, since the object image which is in-focused to each parallax image is obtained, after the photographing, the in-focus position can be adjusted again (refocused) by the refocus processing for moving each parallax image in parallel along the foregoing angle $\theta_a$. In a range out of the range of the effective depth of field of $\pm N_\Theta F\delta$, since only the blurred object image is obtained, the in-focus position cannot be adjusted again (refocused).

Therefore, the defocus amount d from the image pickup plane where the in-focus position can be adjusted again (refocused) after the photographing is limited, and the refocus-possible range of the defocus amount d is substantially equal to a range shown by the following expression (1)

$$|d| \leq N_\Theta F\delta \quad (1)$$

where, the permissible circle of confusion $\delta$ is specified by $\delta = 2\Delta X$ (reciprocal number of a Nyquist frequency $1/(2\Delta X)$ of the pixel period $\Delta X$) or the like.

Subsequently, an image processing method of holding information necessary to refocus from the LF data obtained from the image pickup element of the present embodiment and generating compressed LF data whose data amount has been suppressed will be described by using FIGS. 10 to 14. The operation which will be described with reference to FIG. 10 is executed by the CPU 121 (program) serving as an image processing unit of the invention and the image processing unit 125. Although the addition (addition processing unit) of the signal data is also executed by the image processing unit 125, if such an operation is at least partially executed by the addition read-out in the image pickup element 107, a load of the processing can be reduced (can be shared).

Figure 11:
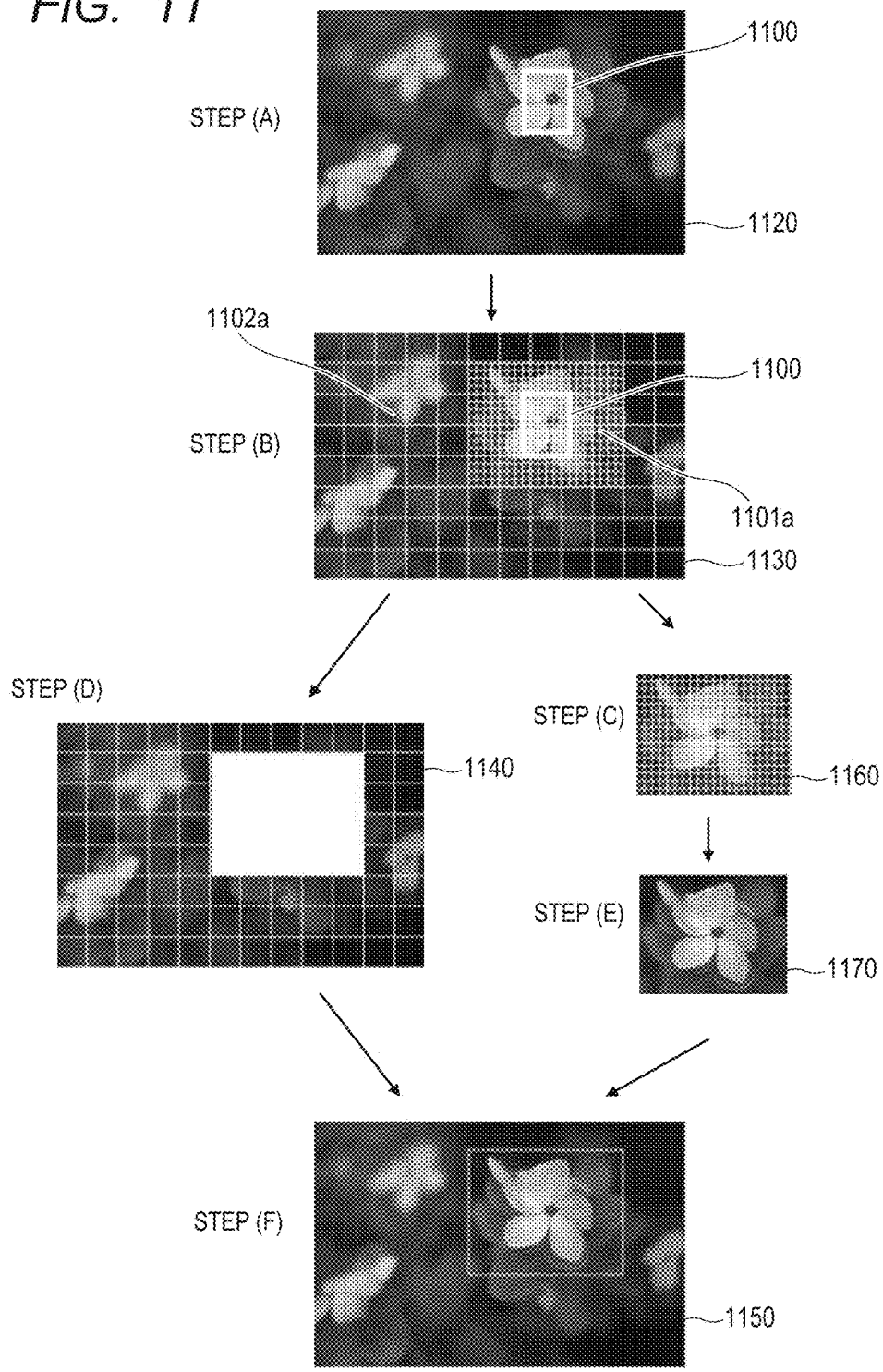
FIG. 11 is a diagram schematically illustrating a flow for the image processing operation according to the first embodiment of the invention.
Figure 12:
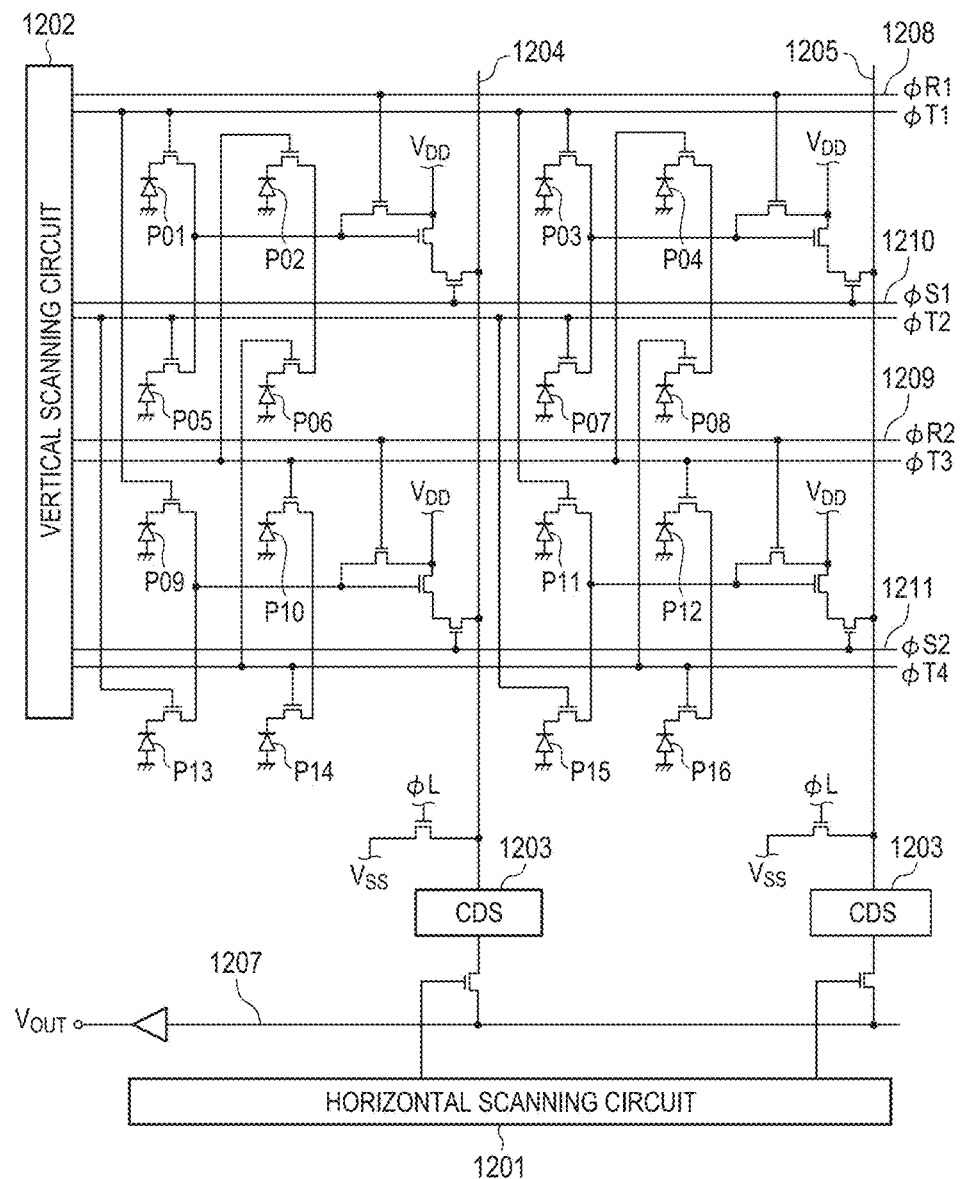
FIG. 12 is a diagram illustrating a read-out circuit of the image pickup element according to the present embodiment of the invention.

FIG. 10 is a diagram illustrating a flowchart for the image processing operation of the present embodiment. FIG. 11 is a diagram schematically illustrating a flow for the image processing operation of the present embodiment by using the photographed image. In FIG. 11, (A) to (F) correspond to STEPS (A) to (F) in FIG. 10, respectively. The diagram schematically and exemplarily illustrates that areas which are set onto a display screen and are subjected to different image processings. FIG. 12 illustrates a construction of a pixel circuit of the image pickup element according to the present embodiment and a construction in which the photoelectric conversion signals of the subpixels in the pixel can be read out by the addition or non-addition. Although FIG. 12 illustrates only a construction of a subpixel read-out circuit in one pixel for convenience of explanation, actually, the apparatus has a similar circuit construction with respect to all of the pixels which are arranged on the light-receiving plane and are used for the picked-up image. The image processing of the present embodiment will now be described hereinbelow along reference characters A to F illustrated in FIGS. 10 and 11. In STEP (A), a focus detection area 1100 to be in-focused is set into the photographing area (setting unit). Subsequently, the LF data of a focus detection area 1100 is read out, the focus detection of the image pickup plane phase difference method is performed, and a defocus amount $d_{1100}$ of the focus detection area 1100 is calculated. The lens is driven in accordance with the calculated defocus amount $d_{1100}$, thereby in-focusing to the object image in the focus detection area 1100. The focus detection of the focus detection area 1100 may be performed by using the focus detecting apparatus of the phase difference method constructed separately from the image pickup element. The focus detection of a contrast method in which the focus detection is performed from contrast evaluation values of a plurality of refocused images which are generated by using the LF data may be performed.

In STEP (B), a first area 1101a including the focus detection area 1100 is set. LF data of the set first area 1101a is read out, the focus detection of the phase difference method is performed for every plural partial pupil areas of the first area 1101a, and a defocus map (in-focus information) is calculated. On the basis of the calculated defocus map, the first area 1101a is set again so as to include an area in which the magnitude of the defocus amount d is smaller than a predetermined value $d_0$ ($|d| \leq d_0$). After the first area 1101a is set again, an area in which the first area 1101a is eliminated from the whole area of the image pickup element is set as a second area 1102a. It is desirable that the predetermined value $d_0$ is set to $d_0 = N_\Theta F\delta$ from the refocus-possible range shown by the expression (1) so that the first area 1101a includes the refocus-possible area. However, a reference of the defocus amount d may be changed from the image pickup plane in accordance with necessity.

It is also possible to construct in such a manner that in accordance with necessity, the second area 1102a which does not include the focus detection area 1100 is set, a defocus map is calculated, and on the basis of the calculated defocus map, the second area is set again and the first area is set. That is, it is also possible to construct in such a manner that the second area 1102a is set again so as to include an area in which the magnitude of the defocus amount d is larger than the predetermined value $d_0$ ($|d|>d_0$) and an area in which the second area 1102a is eliminated from the whole area of the image pickup element is set as a first area 1101a.

Therefore, in the present embodiment, the first area 1101a and the second area 1102a are selected in accordance with the defocus amount of the LF data.

In the case where a processing speed is preferentially set in the photographing of a moving object or the like, the processing for performing the calculation of the defocus map and the resetting of the first area 1101a as mentioned above may be omitted in accordance with necessity.

It is also possible to construct in such a manner that only the setting of the focus detection area 1100 is performed in STEP (A) and, after the first area 1101a and the second area 1102a are set in STEP (B), the lens is driven, thereby in-focusing to the object image in the focus detection area 1100.

In STEP (C), the image data corresponding to the first area is generated. First, the LF data of the first area 1101a is individually read out as signal data of the subpixels 201 to 216 for every pixel. The read-out signal data is used as it is as image data corresponding to the first area in the present embodiment.

Read-out operation control in the case of individually reading out the signal data of the subpixels with respect to each pixel of the image pickup element in the present embodiment will now be described by using FIG. 12. In the diagram, P01 to P16 denote photodiodes (PD) corresponding to the subpixels 201 to 216 (photoelectric conversion units 301 to 316), respectively. $V_{DD}$ and $V_{SS}$ denote power source voltages. φT1 to φT4 denote transfer gate voltages which are supplied from a vertical scanning circuit 1202 in order to transfer photoelectric conversion signals from the PD to the FD. φR1 and φR2 denote reset gate voltages which are supplied from the vertical scanning circuit 1202 to reset lines 1208 and 1209 in order to reset the PD. φS1 and φS2 denote row selection voltages which are supplied from the vertical scanning circuit 1202 to row selection lines 1210 and 1211. φL denotes a load voltage. Vertical output lines 1204 and 1205 are provided to read out the photoelectric conversion signals transferred from the PD to the FD to a horizontal output line 1207 by a horizontal scanning circuit 1201.

First, in order to reset the PD of each subpixel, the vertical scanning circuit 1202 simultaneously turns on the transfer gate voltages φT1 to φT4 and the reset gate voltages φR1 and φR2 of all rows. After that, from the moment when the vertical scanning circuit 1202 is simultaneously turned off the transfer gate voltages φT1 to φT4 and the reset gate voltages φR1 and φR2, the accumulating operation is started. In the accumulating operation, the PD (P01 to P16) of each subpixel accumulates signal charges into an n-type layer of the PD (P01 to P16) of each subpixel in accordance with a light-reception amount.

The accumulation is performed for a predetermined time synchronously with the mechanical shutter. After that, the vertical scanning circuit 1202 turns on the transfer gate voltage φT1 first and turns it off again, thereby transferring the signal charges of the subpixels P01, P03, P09, and P11 to the corresponding FD, respectively. Subsequently, when the vertical scanning circuit 1202 turns on the row selection voltage φS1 and the horizontal scanning circuit 1201 sequentially selects the vertical output lines 1204 and 1205, the signal charges P01 and P03 are sequentially read out to the horizontal output line 1207 through a CDS (Correlated Double Sampling) circuit 1203. After that, the vertical scanning circuit 1202 returns the row selection voltage φS1 to OFF. Similarly, by turning on the row selection voltage φS2 and sequentially selecting the vertical output lines 1204 and 1205, the signal charges P09 and P11 are sequentially read out to the horizontal output line 1207 through the CDS circuit 1203, and the row selection voltage φS2 is returned to OFF. Subsequently, by turning on the transfer gate voltage φT2 and turning it off again, the signal charges of the subpixels P05, P07, P13, and P15 are transferred to the corresponding FD, respectively. The read-out operation of the signal charges is similar to that of the subpixels P01, P03, P09, and P11. Subsequently, by turning on the transfer gate voltage φT3 and turning it off again, the signal charges of the subpixels P02, P04, P10, and P12 are transferred to the corresponding FD, respectively. The read-out operation of the signal charges is similar to that of the subpixels P01, P03, P09, and P11. Finally, by turning on the transfer gate voltage φT4 and turning it off again, the signal charges of the subpixels P06, P08, P14, and P16 are transferred to the corresponding FD, respectively. The read-out operation of the signal charges is similar to that of the subpixels P01, P03, P09, and P11. By those read-out operations, the photoelectric conversion signals of all of the subpixels of one pixel can be individually read out.

By executing the read-out operation to each pixel in the first area 1101a, the signal data of the subpixels 201 to 216 are individually read out and generated as LF data in which the image data of the first area 1101a is not added.

In STEP (D), the image data corresponding to the second area is generated. The LF data of the second area 1102a is generated as picked-up image data in which the signal data of the subpixels 201 to 216 which are read out every pixel are added by an adding unit of the image processing unit 125 and all of the signal data of the subpixels 201 to 216 are added. The CPU 121 combines the LF data corresponding to the first area and the image data in which all of the signal data of the subpixels corresponding to the second area are added, and stores as image data of the final photographed image into a recording medium in a predetermined recording format as illustrated in, for example, FIG. 13, which will be described hereinafter.

In the present embodiment, in the first area, a (non-addition) signal in which the LF data of each subpixel is held is generated from the LF data serving as an image pickup signal. On the other hand, in the second area, compressed LF data serving as pixel signal data in which a part or all of the LF data of the subpixels have been added is generated. As mentioned above, a degree of addition of the LF data in the first area is smaller than a degree of addition of the LF data in the second area. That is, a part of the image pickup signals of the subpixels which are obtained from the image pickup element are added in such a manner that the number of pixel signals of the subpixels per unit pixel in the image data of the photographed image corresponding to the first area is larger than that of the subpixels per unit pixel in the image data of the photographed image corresponding to the second area, and then the image data of the photographed image is generated.

That is, in the present embodiment, the degree of addition in the first area of the picked-up image to the LF data and the degree of addition in the second area of the picked-up image to the LF data are made different, the first image data and the second image data are generated, and the third image data of the final photographed image is obtained.

A suppression effect of the data amount according to the present embodiment will be described.

Since the LF data of the number of effective pixels $N_{LF}$ has angle distribution data as well as the space distribution data of the light intensity, it is constructed by the subpixel data of the number $N_p = N_\theta \times N_\theta$ of pupil division with respect to each pixel. Therefore, a data amount of the number $N = N_\theta \times N_\theta \times N_{LF}$ of effective subpixels $N = N_\theta \times N_\theta \times N_{LF}$ increases remarkably.

However, the defocus amount d of image data which can be refocused after the photographing is limited to a value within the refocus-possible range shown by the expression (1). Therefore, in an area out of the refocus-possible range shown by the expression (1), even if the data amount is increased and the LF data is obtained, the image data cannot be refocused.

In the present embodiment, therefore, in the first area including the area where the defocus amount d substantially lies within the refocus-possible range, the obtained LF data is held as it is. In the other second area, in order to suppress the data amount, compressed LF data in which the LF data of the subpixels is added for every pixel to thereby form the image pickup data is generated. The LF data of the first area and the LF data of the second area are combined, thereby obtaining the image data of the final photographed image. Thus, while the information necessary to refocus is held, the data amount can be suppressed.

For example, in the case of the image pickup element in which the number of effective pixels is equal to 10.14 million pixels and the number of pupil division is equal to 16=4×4, the number of effective pixels which are necessary to the LF data is equal to about 162 million pixels and a large amount of data which is 16 times as large as the number of effective pixels is necessary. In the case where an area of 25% of the whole area of the image pickup element is set into the first area, an area of 75% is set into the second area, and the present embodiment is applied, while the information necessary to refocus is held, the data amount of the obtained original LF data can be suppressed to a data amount of about 30% of the original LF data. In the present embodiment, the LF data corresponding to the first area is maintained as it is without adding the subpixels, all of the subpixels are added to the LF data corresponding to the second area every unit pixel, and the final photographed image data is generated from both of those data. However, the invention is not limited to it but if the addition is performed in such a manner that the number of image pickup signals of the subpixels per unit pixel with respect to the image data of the photographed image corresponding to the first area is larger than that for the image data of the photographed image corresponding to the second area, the number of subpixels to be added (the number of subpixels to be left per unit pixel) and a combination are not limited.

Figure 13:
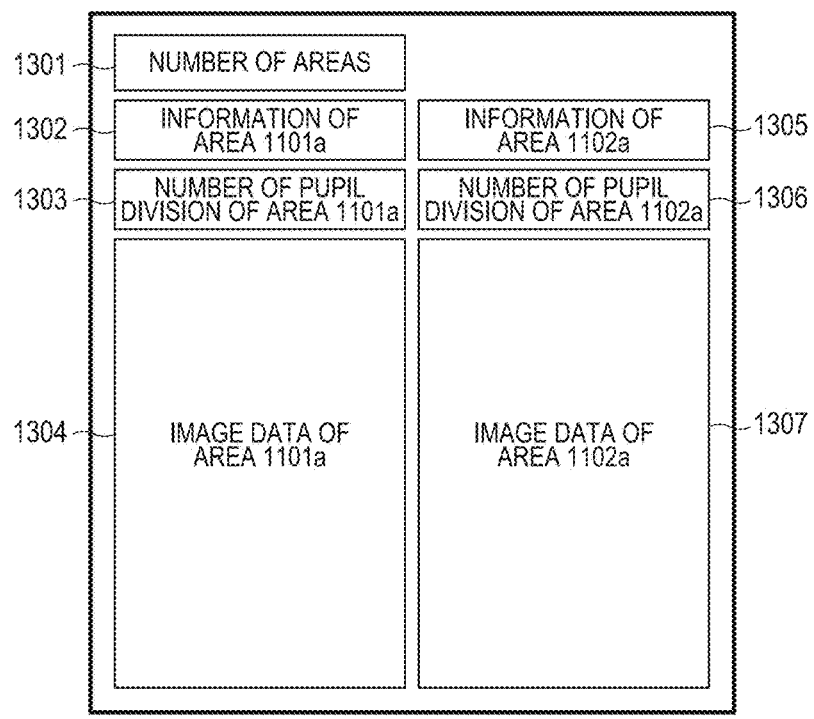
FIG. 13 is a diagram illustrating a construction of recording data according to the first embodiment of the invention.

FIG. 13 illustrates a construction of recording data in the case where the final image data of the photographed image according to the present embodiment is stored into a recording apparatus or the like. In the example of FIG. 13, as image data of the photographed image from the image pickup element 107, a storage area is made different every area where the degree of addition of the subpixels as mentioned above is constructed differently. That is, the recording area of the final image data of the photographed image is constructed by a set of a plurality of recording areas in which the image data of each area in the photographed image is recorded. The number of set areas 1301 is stored in the recording area of the final image data of the photographed image. The component elements of the recording area corresponding to the image data of each area is constructed by: information 1302 and 1305 (coordinate information showing a range in the final photographed image in each area) of the set areas (1101a, 1102a); the numbers of subpixels 1303 and 1306 (the number of pupil division) in the areas; and image data 1304 and 1307 according to the numbers of subpixels in the areas. Other component elements such as a set focus detection area and the like may be included in accordance with necessity. The generation and recording of the recording data in the present embodiment are executed to a recording medium such as a flash memory 133 by the operations of the image processing unit 125 and the recording unit 134 under control of the CPU 121 of the image pickup apparatus in FIG. 1.

Subsequently, an image processing for generating refocused image data from the compressed LF data in the present embodiment will be described by using FIG. 11. This image processing is also executed by the operation of the image processing unit 125 under control of the CPU 121.

In STEP (E), a predetermined refocus amount is set into each area and refocused image data corresponding to each area is generated. In the present embodiment, in the second area, since all of the subpixels are added, the refocus processing is not executed but a refocused image according to the predetermined refocus amount of the first area is generated from the LF data of the first area obtained in STEP (C).

In STEP (F), final refocused image data of the whole image is generated. In the present embodiment, by composing the refocused image of the first area generated in STEP (E) and the image data of the second area generated in STEP (D), a final refocused image corresponding to the whole photographed image is generated.

Figure 14:
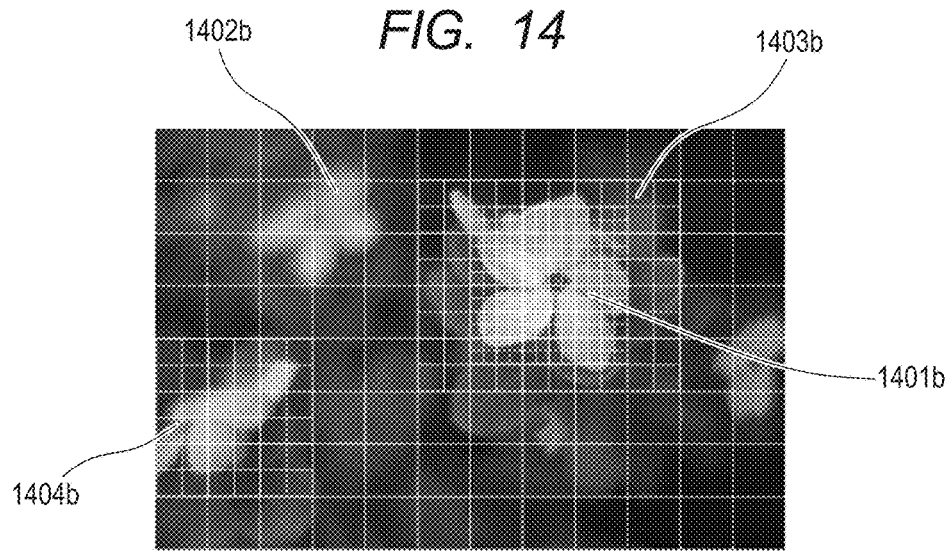
FIG. 14 is a diagram illustrating another setting example of a first area and a second area in the first embodiment of the invention.

The areas in the LF data which are set are not limited to a first area 1401b and a second area 1402b but third areas 1403b and 1404b in which a degree of addition of the subpixels differs from those of the first and second areas may be set as illustrated in FIG. 14. In the third areas 1403b and 1404b in FIG. 14, there is generated (2×2)-division LF data constructed by: an added signal A11 of the signals of the four subpixels P01, P02, P05, and P06; an added signal A12 of the signals of the four subpixels P03, P04, P07, and P08; an added signal A21 of the signals of the four subpixels P09, P10, P13, and P14; and an added signal A22 of the signals of the four subpixels P11, P12, P15, and P16. It is not always necessary that the third areas are one area but may be constructed by a plurality of areas such as third areas 1403b and 1404b in FIG. 14. This is true of the first area and the second area.

In the image processing unit 125, a dark correction, a shading correction, a de-mosaicking correction, and the like may be performed to any one of the first image data, the second image data, and the third image data or to a plurality of combinations thereof.

The image is displayed by the display unit 131 on the basis of the third image data generated by the foregoing image processing operation.

The present embodiment is an example of the image pickup apparatus having the image processing unit for executing the image processing operation mentioned above. The present embodiment is an example of the display unit having the image processing unit for executing the image processing operation mentioned above.

By the foregoing construction, the necessary information is held and the data amount of the LF data can be remarkably suppressed.

Example 2

Subsequently, the second embodiment of the invention will be described. The present embodiment is an embodiment for accomplishing the suppression of the data amount in the case of generating parallax image data from the LF data. The image processing operation for holding the information necessary to generate a plurality of parallax images from the LF data according to the present embodiment and generating the compressed LF data in which the data amount is suppressed will be described by using FIGS. 15 and 16.

Figure 15:
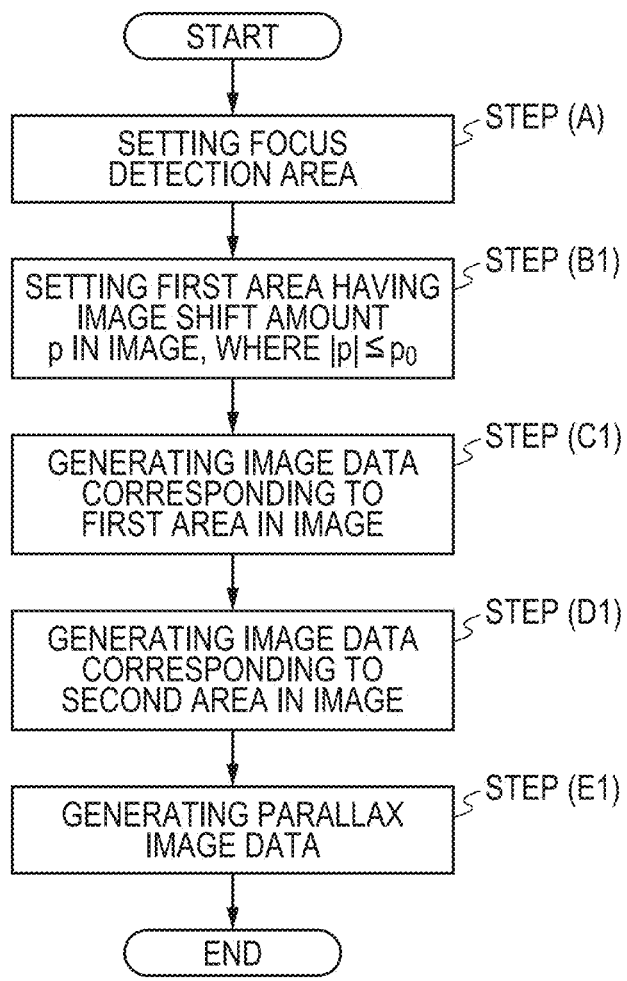
FIG. 15 is a diagram illustrating a flowchart for the image processing operation according to the second embodiment of the invention.
Figure 16:
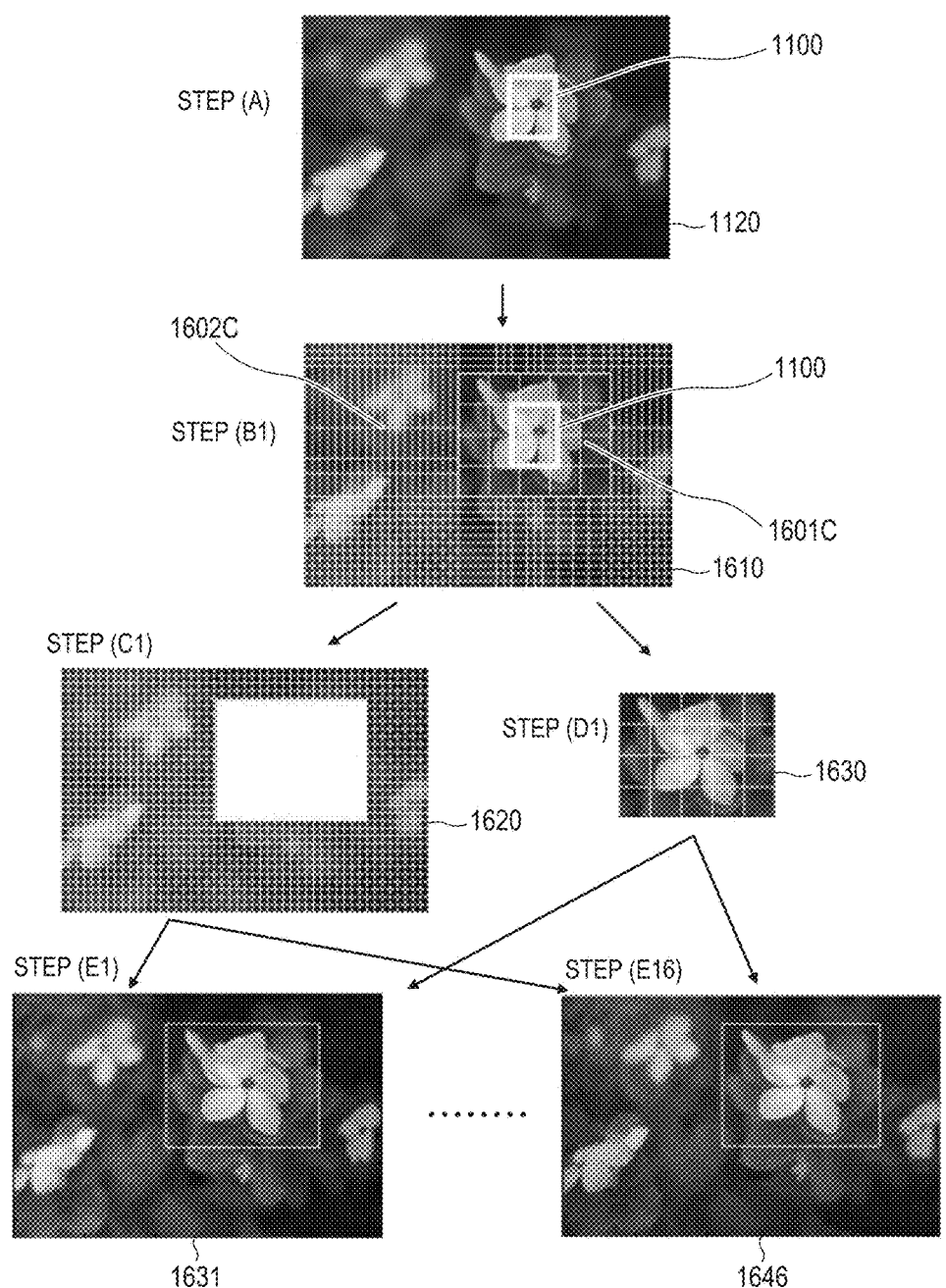
FIG. 16 is a diagram schematically illustrating a flow for the image processing operation according to the second embodiment of the invention.

FIG. 15 is a diagram illustrating a flowchart for the image processing operation of the present embodiment in a manner similar to FIG. 11 of the first embodiment. FIG. 16 is a diagram schematically illustrating a flow for the image processing operation of the present embodiment by using the picked-up image and schematically illustrates the areas which are set onto the display screen and shows an example in which they become subjects of the different image processings. In the diagrams, the same portions as those in FIGS. 10 and 11 are designated by the same reference numerals. The operations which will be described with reference to FIGS. 15 and 16 are also executed by the CPU 121 (program) and the image processing unit 125. Although the addition of the signal data is also executed by the image processing unit 125, if it is at least partially executed as an addition read-out of the image pickup signals in the image pickup element 107, a load of the processing can be reduced (can be shared).

STEP (A) is similar to STEP (A) in FIG. 10.

In STEP (B1), a first area 1602c which does not include the focus detection area 1100 is set. LF data of the set first area 1602c is read out, the focus detection of the phase difference method is performed every plural partial areas in the first area 1602c is performed, and an image shift amount map is calculated. On the basis of the calculated image shift amount map, the first area 1602c is set again so as to include an area where a magnitude of the image shift amount p is larger than the predetermined value $p_0$ ($|p| \geq p_0$). After the first area 1602c is set, an area in which the first area 1602c is eliminated from the whole area of the image pickup element is set as a second area 1601c.

It is also possible to construct in such a manner that, in accordance with necessity, the second area 1601c including the focus detection area 1100 is set, an image shift amount map is calculated, and on the basis of the calculated image shift amount map, the second area may be set again and the first area is set. That is, it is also possible to construct in such a manner that the second area 1601c is set again so as to include an area where the magnitude of the image shift amount p is smaller than the predetermined value $p_0$ ($|p| < p_0$) and an area in which the second area 1601c is eliminated from the whole area of the image pickup element may be set as a first area 1602c.

Therefore, in the second embodiment, the first area and the second area are selected in accordance with the image shift amount of the LF data.

In the case where a processing speed is preferentially set in the photographing of a moving object or the like, the processing for performing the calculation of the image shift amount map and the resetting of the first area 1602c as mentioned above may be omitted in accordance with necessity.

In STEP (C'), the signal data of the subpixels 201 to 216 is individually read out as LF data of the first area 1602c. The operation for individually reading out the signal data of the subpixels of each pixel in the present embodiment is similar to that in the first embodiment.

With respect to each pixel of the first area 1602c, the signal data of the subpixels 201 to 216 is individually read out and the image data in which the LF data has been held is generated.

In STEP (D1), all of the LF data of the subpixels 201 to 216 is added with respect to each pixel of the second area 1601c. The addition read-out operation of the LF data of the subpixels in each pixel of the second area 1601c in the present embodiment is similar to that in the first embodiment.

With respect to each pixel of the second area 1601c, all of the LF data of the subpixels 201 to 216 is added and the picked-up image data is generated.

In the present embodiment, in the first area, a (non-addition) signal in which the LF data is held as it is generated from the LF data serving as an image pickup signal. On the other hand, in the second area, compressed LF data serving as pixel signal data in which all of the LF data of the subpixels are added is generated. As mentioned above, the degree of addition of the LF data in the second area is larger than the degree of addition of the LF data in the first area.

In the case of generating a plurality of parallax images (viewpoint images) from the LF data, in the area where the magnitude of the image shift amount p is small, the same picked-up image can be used for the plurality of parallax images on the assumption that the image shift amount is such an amount that the parallax is inconspicuous.

In the present embodiment, therefore, in the first area including an area where the image shift amount p among the subpixels corresponding to the different partial pupil areas of the photographed image is smaller than the predetermined value $p_0$, in order to suppress the data amount, the LF data of the subpixels of each pixel is added and the compressed LF data is generated. In the other second area, by holding the obtained LF data as it is, the image pickup data is generated. Therefore, by the construction of the present embodiment, the information necessary to generate a plurality of parallax images is held and the data amount can be suppressed.

The image processing operation for generating a plurality of parallax images from the compressed LF data in the present embodiment will be described hereinbelow by using FIG. 16.

In STEP (E1), by selecting the signal of the specific subpixel among the subpixels 201 to 216 of each pixel, parallax images of a plurality of first areas are generated from the LF data of the second area obtained in STEP (C1). By combining the generated parallax images of the plurality of first areas and the picked-up image of the second area generated in STEP (D1), a plurality of parallax images are generated. Since the recording and display of the third image data are similar to those in the first embodiment, their description is omitted here.

By the foregoing construction, even in the present embodiment, the necessary information is held and the data amount of the LF data can be remarkably suppressed.

The functions of the processings illustrated in FIGS. 10 and 15 in the foregoing embodiments are realized by a method whereby a program for realizing the functions of the processings is read out of a memory and the CPU 121 executes it.

The invention is not limited to the foregoing construction but the functions of all or a part of the processings illustrated in FIGS. 10 and 15 may be realized by dedicated hardware. The foregoing memory can be constructed by a magnetooptic disk device, a non-volatile memory such as a flash memory or the like, a read-only recording medium such as a CD-ROM or the like, or a volatile memory other than a RAM. It can be also constructed by a computer-readable and writable recording medium by a combination of them.

The processings may be executed by a method whereby the program for realizing the functions of the processings illustrated in FIGS. 10 and 15 is recorded in the computer-readable recording medium, and the program recorded in the recording medium is read out and stored into a computer system and is executed. It is assumed that the "computer system" mentioned here includes OS and hardware such as peripheral equipment or the like. Specifically speaking, the invention incorporates a case where, first, the program which is read out of a storage medium is written into a memory provided for a function expanding board inserted in the computer or a function expanding unit connected to the computer, a CPU or the like provided for the function expanding board or function expanding unit executes a part or all of actual processings on the basis of instructions of the program, and the functions of the present embodiments mentioned above are realized by those processings.

"computer-readable recording medium" denotes a portable medium such as flexible disk, magnetooptic disk, ROM, CD-ROM, or the like, or a storage device such as a hard disk built in the computer system or the like. Further, it is assumed that "computer-readable recording medium" denotes a medium which holds the program for a predetermined time. For example, it is a volatile memory (RAM) in a computer system serving as a server or a client in the case where the program has been transmitted through a network such as Internet or the like or a communication line such as a telephone line or the like.

The program may be transmitted from the computer system in which the program has been stored in a storage device or the like through a transmission medium or by a transmission wave in the transmission medium to another computer system. "Transmission medium" for transmitting the program denotes a medium having an information transmitting function such as network (communication network) like Internet or the like or communication line (communication wire) like a telephone line or the like.

The program may be a program for realizing a part of the foregoing functions. Further, it may be what is called a differential file (differential program) which can realize the foregoing functions by a combination with a program which has already been recorded in the computer system.

A program product such as a computer-readable recording medium or the like in which the program has been recorded can be also applied as an embodiment of the invention. The foregoing program, recording medium, transmission medium, and program product are also incorporated in the purview of the invention.

Although the embodiments of the invention have been described above in detail with reference to the drawings, the specific construction is not limited to those embodiments but a design and the like within a range without departing from the gist of the invention are also incorporated.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. An image processing apparatus for processing image pickup signals obtained by an image pickup element constructed by arranging a plurality of unit pixels each of which is constructed by a plurality of subpixels for receiving light passing through different partial pupil areas of a focusing optical system and generating image data of a photographed image which is photographed by the image pickup element, comprising:
one or more memories storing machine-readable instructions;
one or more processors that access the one or more memories and execute the machine-readable instructions, wherein the machine-readable instructions, when executed by the one or more processors, cause the image processing apparatus to:
set a first area and a second area different from the first area onto the photographed image; and
generate the image data in which a number of pixel signals per unit pixel in the first area is larger than a number of pixel signals per unit pixel in the second area; and
a recorder configured to record the image data into a recording medium in a predetermined recording format.

2. An image processing apparatus according to claim 1, wherein the machine-readable instructions, when executed by the one or more processors, further cause the image processing apparatus to obtain in-focus information of the photographed image, and
wherein the first and second areas are set on the basis of the in-focus information.

3. An image processing apparatus according to claim 1, wherein the machine-readable instructions, when executed by the one or more processors, further cause the image processing apparatus to obtain an image shift amount between the plurality of subpixels corresponding to the different partial pupil areas of the photographed image, and
wherein the first and second areas are set on the basis of the image shift amount.

4. An image processing apparatus according to claim 2, wherein the in-focus information is a magnitude of a defocus amount of a predetermined area on the photographed image.

5. An image processing apparatus according to claim 1, wherein the first area is set as an area in which a magnitude of a defocus amount is smaller than a predetermined value, and the second area is set as an area in which the magnitude of a defocus amount is larger than the predetermined value.

6. An image processing apparatus according to claim 3, wherein the first area is set as an area in which the image shift amount is larger than a predetermined value, and the second area is set as an area in which the image shift amount is smaller than the predetermined value.

7. An image processing apparatus according to claim 1, wherein the machine-readable instructions, when executed by the one or more processors, further cause the image processing apparatus to read out the image data of the photographed image from the recording medium, add the image pickup signals of subpixels corresponding to the first area in the image data of the photographed image, generate refocused image data corresponding to the first area, combine the generated refocused image data and the image data of the photographed image corresponding to the second area, and generate a refocused image of the photographed image.

8. An image processing apparatus according to claim 1, wherein the image data of the photographed image is read out from the recording medium, parallax image data is generated from the image data of the photographed image corresponding to the first area, each of the generated parallax image data and the image data of the photographed image corresponding to the second area are combined, and a plurality of parallax images of the photographed image are generated.

9. An image processing apparatus according to claim 1, wherein the machine-readable instructions, when executed by the one or more processors, further cause the image processing apparatus to set a focus detection area in the photographed image, and set the first area so as to include the focus detection area.

10. An image pickup apparatus comprising:
an image processing apparatus according to claim 1; and
the image pickup element.

11. An image pickup apparatus according to claim 7, further comprising a display unit, wherein the display unit displays the refocused image or a plurality of parallax images which are generated with respect to the photographed image.

12. An image processing apparatus according to claim 2, wherein the image processing apparatus calculates an image shift amount between parallax images of the predetermined area of the photographed image by a correlation arithmetic operation, thereby calculating the in-focus information.

13. An image processing apparatus according to claim 2, wherein the machine-readable instructions, when executed by the one or more processors, further cause the image processing apparatus to calculate the in-focus information on the basis of contrast evaluation values of a plurality of refocused images which are generated on the basis of the image pickup signals of subpixels of the photographed image.

14. An image processing method of processing image pickup signals constructed by arranging a plurality of unit pixels each of which is constructed by a plurality of subpixels for receiving light passing through different partial pupil areas of a focusing optical system and generating image data of a photographed image which is photographed by an image pickup element, comprising:

obtaining in-focus information of the photographed image;

setting a first area and a second area different from the first area onto the photographed image on the basis of the in-focus information;

generating the image data in which a number of pixel signals per unit pixel in the first area is larger than a number of pixel signals per unit pixel in the second area; and recording the image data of the photographed image into a recording medium in a predetermined recording format.

15. A non-transitory computer-readable recording medium which records a program in a control method of an image processing apparatus for processing image pickup signals of subpixels obtained by an image pickup element constructed by arranging a plurality of unit pixels each of which is constructed by a plurality of subpixels for receiving light passing through different partial pupil areas of a focusing optical system and generating image data of a photographed image which is photographed by the image pickup element, wherein the program operates a computer to:

obtain in-focus information of the photographed image;

set a first area and a second area different from the first area onto the photographed image on the basis of the in-focus information which is obtained by the one or more obtaining processors;

generate the image data in which a number of pixel signals per unit pixel in the first area is larger than a number that of pixel signals per unit pixel in the second area; and record the image data of the photographed image into a recording medium in a predetermined recording format.

16. An image processing apparatus according to claim 1, wherein the image data is generated by combining subpixels of a unit pixel with each other.

* * * * *